(12) United States Patent
Yoshida

(10) Patent No.: US 9,537,023 B2
(45) Date of Patent: Jan. 3, 2017

(54) IMAGE PICKUP APPARATUS AND IMAGE PICKUP APPARATUS MANUFACTURING METHOD

(71) Applicant: OLYMPUS CORPORATION, Tokyo (JP)

(72) Inventor: Kazuhiro Yoshida, Kamiina-gun (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 13/734,086

(22) Filed: Jan. 4, 2013

(65) Prior Publication Data
US 2013/0119501 A1    May 16, 2013

Related U.S. Application Data

(63) Continuation of application No. PCT/JP2011/063104, filed on Jun. 8, 2011.

(30) Foreign Application Priority Data

Jul. 5, 2010 (JP) .............. JP2010-153462

(51) Int. Cl.
*H01L 31/0232* (2014.01)
*H01L 31/18* (2006.01)
(Continued)

(52) U.S. Cl.
CPC ..... *H01L 31/02327* (2013.01); *H01L 23/3114* (2013.01); *H01L 27/14618* (2013.01);
(Continued)

(58) Field of Classification Search
CPC .. H01L 27/146; H01L 23/12; H01L 27/14623; H01L 31/02327; H04N 5/369
(Continued)

(56) References Cited

U.S. PATENT DOCUMENTS 6,476,417 B2 * 11/2002 Honda .............. H01L 27/14618
257/59
8,691,617 B2 * 4/2014 Kim .................. H01L 27/14603
438/70
(Continued)

FOREIGN PATENT DOCUMENTS

EP        1081944 A2    3/2001
JP     2001-128072 A    5/2001
(Continued)

OTHER PUBLICATIONS

Extended Supplementary European Search Report dated Feb. 18, 2014 from related European Application No. 11 80 3411.5.

*Primary Examiner* — Fernando L Toledo
*Assistant Examiner* — Christine L Hagan
(74) *Attorney, Agent, or Firm* — Scully, Scott, Murphy & Presser, P.C.

(57) ABSTRACT

An image pickup apparatus includes: an image pickup device disposed in a first principal surface of a silicon substrate, the image pickup device sensing infrared light; an electrode pad disposed on the first principal surface; a front-face wiring connecting the image pickup device and the electrode pad; an external connection terminal disposed on a second principal surface of the silicon substrate; a back-face wiring connecting the electrode pad and the external connection terminal via a substrate through-hole extending from the second principal surface side through the silicon substrate to a back face of the electrode pad; and a light blocking layer disposed on the second principal surface, the light blocking layer covering a trench portion surrounding the image pickup device and a region surrounded by the trench portion.

11 Claims, 3 Drawing Sheets

(51) Int. Cl.
*H04N 5/33* (2006.01)
*H01L 23/31* (2006.01)
*H01L 27/146* (2006.01)
*H04N 5/225* (2006.01)

(52) U.S. Cl.
CPC .. *H01L 27/14623* (2013.01); *H01L 27/14634* (2013.01); *H01L 27/14636* (2013.01); *H01L 31/18* (2013.01); *H04N 5/2253* (2013.01); *H04N 5/33* (2013.01); *H01L 27/1469* (2013.01); *H01L 2924/0002* (2013.01)

(58) Field of Classification Search
USPC .................................. 257/433–435
See application file for complete search history.

(56) References Cited

U.S. PATENT DOCUMENTS

| | | | | |
|---|---|---|---|---|
| 8,741,683 B2* | 6/2014 | Huang | ................ | H01L 23/3171 257/433 |
| 8,766,156 B2* | 7/2014 | Kawashima | ...... | H01L 27/14623 250/208.1 |
| 8,772,898 B2* | 7/2014 | Mao | .................. | H01L 27/14623 257/432 |
| 9,177,982 B2* | 11/2015 | Mao | .................. | H01L 27/14623 |
| 2005/0104991 A1 | 5/2005 | Hoshino et al. | | |
| 2008/0283951 A1* | 11/2008 | Nabe | ................. | H01L 21/76898 257/433 |
| 2009/0096051 A1 | 4/2009 | Sugiyama et al. | | |
| 2009/0256260 A1* | 10/2009 | Nakamura | ..................... | 257/758 |
| 2010/0090304 A1* | 4/2010 | Liu | ................... | H01L 21/76898 257/432 |
| 2010/0109114 A1 | 5/2010 | Izumi | | |
| 2011/0089517 A1* | 4/2011 | Venezia | ............ | H01L 27/14603 257/447 |
| 2013/0200396 A1* | 8/2013 | Zheng | ................. | H01L 27/1464 257/80 |

FOREIGN PATENT DOCUMENTS

| | | |
|---|---|---|
| JP | 2008-288309 A | 11/2008 |
| JP | 2009-099591 A | 5/2009 |
| JP | 2010-114199 A | 5/2010 |

* cited by examiner

IMAGE PICKUP APPARATUS AND IMAGE PICKUP APPARATUS MANUFACTURING METHOD

CROSS REFERENCE TO RELATED APPLICATION

This application is a continuation application of PCT/JP2011/063104 filed on Jun. 8, 2011 and claims benefit of Japanese Application No. 2010-153462 filed in Japan on Jul. 5, 2010, the entire contents of which are incorporated herein by this reference.

BACKGROUND OF THE INVENTION

1. Field of the Invention

The present invention relates to an image pickup apparatus including a semiconductor substrate with a solid-state image pickup device disposed therein and a method for manufacturing the image pickup apparatus, and specifically relates to a CSP (chip scale package)-type image pickup apparatus and a method for manufacturing the image pickup apparatus.

2. Description of the Related Art

Along with reduction in size and thickness of electronic apparatuses, there is an increasing demand for high-density mounting for semiconductor apparatuses. In response to the demand, what is called a chip mounting technique in which a semiconductor bare chip or a CSP-type semiconductor apparatus is directly mounted on a wiring board has been proposed. For example, a CSP-type semiconductor apparatus includes a semiconductor device disposed in a first principal surface of a semiconductor substrate, electrode pads disposed on the first principal surface, external connection terminals disposed on a second principal surface of the semiconductor substrate, substrate through-holes extending from the second principal surface through the semiconductor substrate to back faces of the respective electrode pads, and back-face wirings electrically connecting the back faces of the respective electrode pads and the respective external connection terminals via the respective substrate through-holes. The CSP-type semiconductor apparatus enables elimination of the need to provide a space for mounting, e.g., bonding wires.

Chip scale packaging for various configurations of image pickup apparatuses including an image pickup device fabricated on a semiconductor substrate such as a CCD image sensor or a CMOS image sensor has been proposed. However, light passing through the inside of the semiconductor substrate may adversely affect the image pickup device.

Japanese Patent Application Laid-Open Publication Nos. 2001-128072 and 2009-099591 each propose that a light blocking layer is provided on a back face of a semiconductor substrate included in an image pickup apparatus.

SUMMARY OF THE INVENTION

An image pickup apparatus according to an embodiment includes: a semiconductor substrate including a first principal surface and a second principal surface, the semiconductor substrate transmitting infrared light; an image pickup device disposed in the first principal surface, the image pickup device including an image pickup section that senses visible light and the infrared light; an electrode pad disposed on the first principal surface; a front-face wiring disposed on the first principal surface, the front-face wiring connecting the image pickup device and the electrode pad; an external connection terminal disposed on the second principal surface; a back-face wiring disposed on the second principal surface, the back-face wiring connecting the electrode pad and the external connection terminal via a substrate through-hole extending from the second principal surface through the semiconductor substrate to a back face of the electrode pad; and a light blocking layer disposed on the second principal surface, the light blocking layer covering a frame-like trench portion surrounding a region of the second principal surface, the region facing the image pickup section, and the region of the second principal surface surrounded by the trench portion.

A method for manufacturing an image pickup apparatus according to another embodiment includes: a device substrate fabricating step of fabricating an image pickup device substrate including, on a first principal surface of a semiconductor substrate including the first principal surface and a second principal surface and transmitting infrared light, an image pickup device including an image pickup section that senses visible light and the infrared light, an electrode pad, and a front-face wiring connecting the image pickup device and the electrode pad; a through-hole/trench portion forming step of etching the second principal surface of the semiconductor substrate to simultaneously form a substrate through-hole located at a position facing the electrode pad, the substrate through-hole extending through the semiconductor substrate, and a trench portion surrounding a region facing the image pickup section so as to form a frame-like shape; and a back-face wiring/light blocking layer disposing step of simultaneously disposing a back-face wiring extending from a back face of the electrode pad to the second principal surface via the substrate through-hole, and a light blocking layer covering the trench portion and the region surrounded by the trench portion, on the second principal surface.

DETAILED DESCRIPTION OF THE PREFERRED EMBODIMENT

Figure 1:
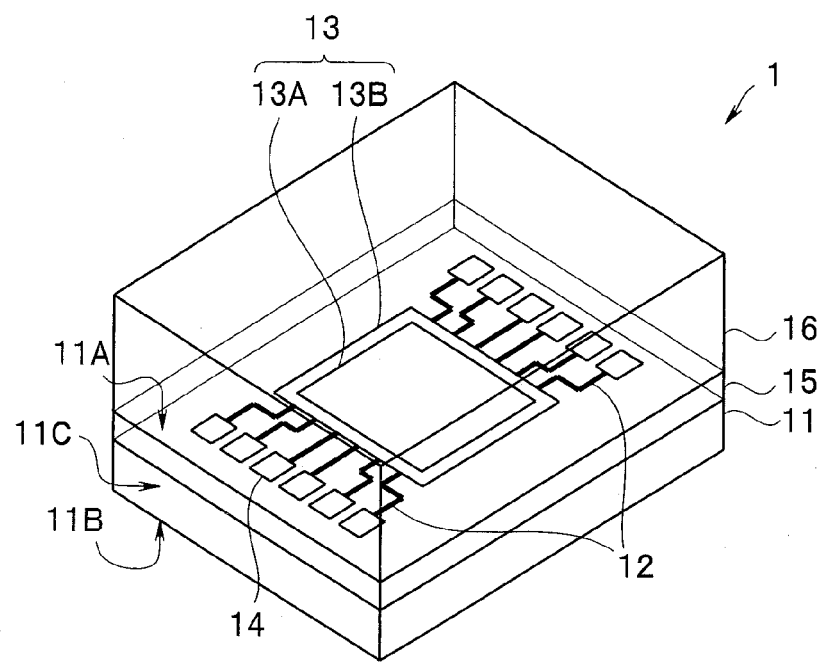
FIG. 1 is a perspective view of an image pickup apparatus according to an embodiment as viewed from a first principal surface side.
Figure 2:
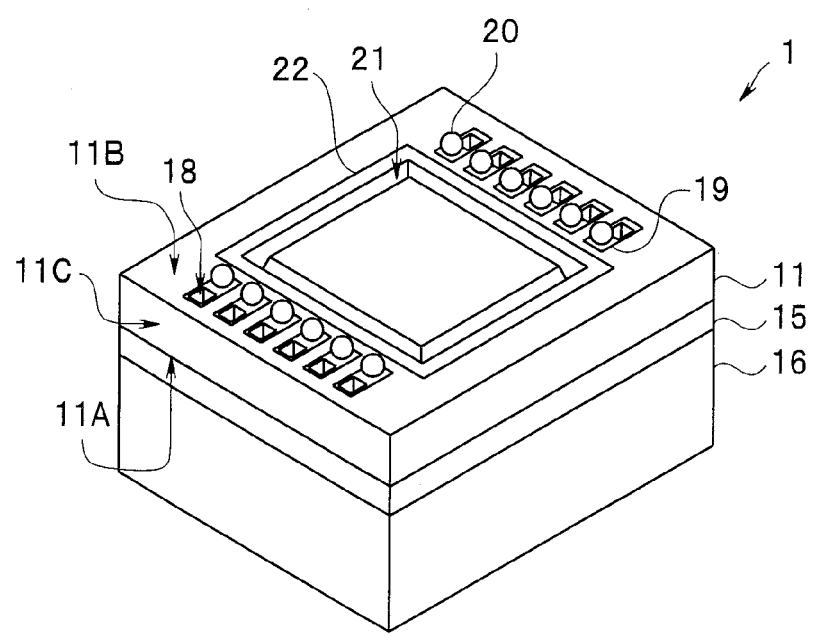
FIG. 2 is a perspective view of the image pickup apparatus according to the embodiment as viewed from a second principal surface side.
Figure 3:
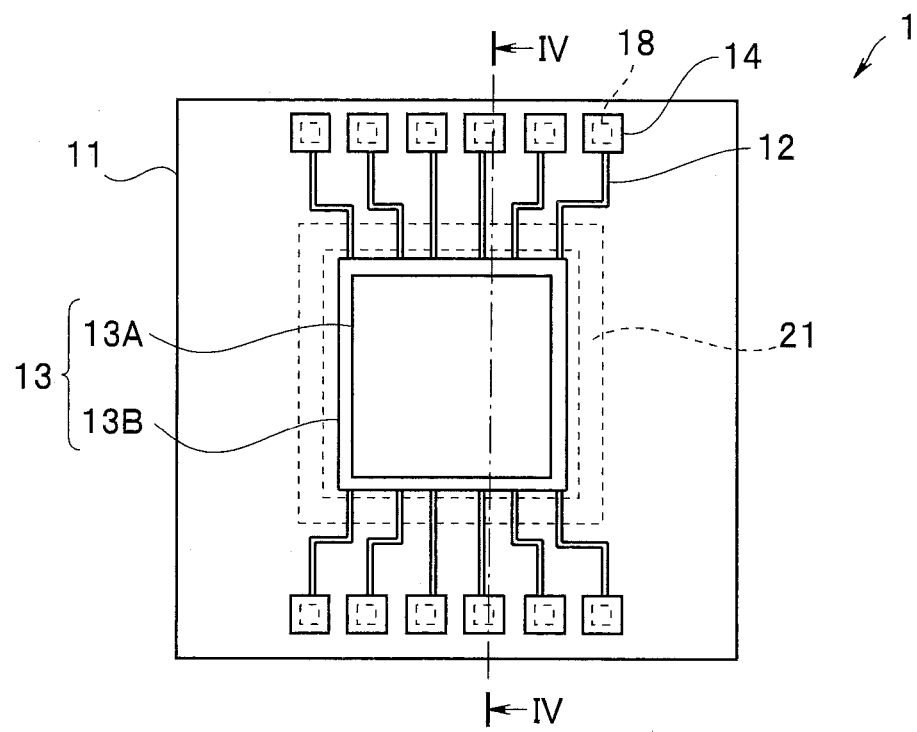
FIG. 3 is a plan view of the image pickup apparatus according to the embodiment as viewed from the first principal surface side.
Figure 4:
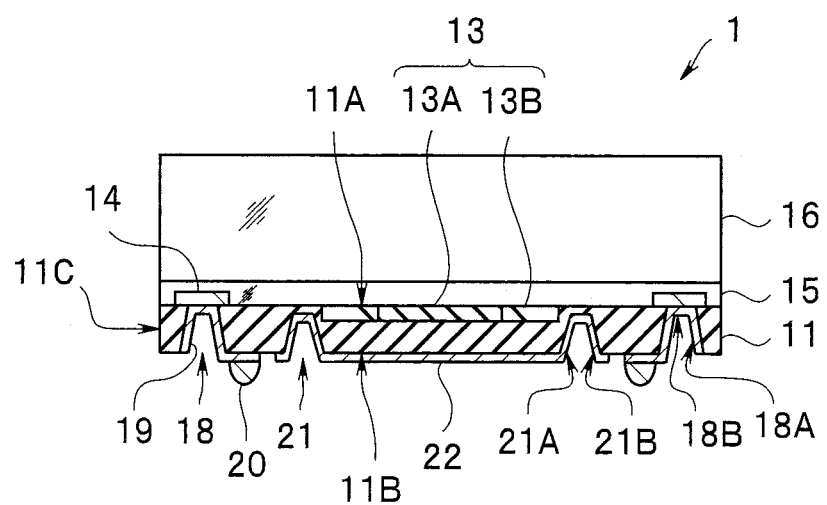
FIG. 4 is a cross-sectional view of the image pickup apparatus according to the embodiment, taken along line IV-IV in FIG. 3.

The present invention will be described taking an image pickup apparatus 1 according to an embodiment as an example. As illustrated in FIGS. 1 to 4, the image pickup apparatus 1 includes a silicon substrate 11, which is a semiconductor substrate that transmits infrared light, and a glass substrate 16, which is a transparent substrate bonded to a first principal surface 11A of the silicon substrate 11 via a bonding layer 15.

An image pickup device 13 is disposed in the first principal surface 11A of the silicon substrate 11. The image pickup device 13 includes an image pickup section 13A, and a peripheral circuit portion 13B disposed in the periphery of the image pickup section 13A. The image pickup device 13 senses not only visible light but also infrared light having wavelengths of, for example, 820 to 1170 nm.

The image pickup section 13A includes a light receiving region in which a plurality of photodiodes are disposed, and a color filter disposed on the light receiving region and microlenses disposed on the color filter.

The peripheral circuit portion 13B is a driving/signal processing circuit including, e.g., shift registers, an output amplifier, an A/D converter and a memory circuit.

In the periphery of the image pickup device 13, a plurality of electrode pads 14 each including a conductive film of, e.g., aluminum are disposed, and the respective electrode pads 14 are electrically connected to the image pickup device 13 via respective front-face wirings 12. Note that the electrode pads 14 and the front-face wirings 12, and the silicon substrate 11 are insulated by an insulating layer (not illustrated) of, e.g., silicon oxide.

Below each of the electrode pads 14, a substrate through-hole (hereinafter also referred to as "through-hole") 18 extending through the silicon substrate 11 is formed. Note that the through-hole 18 is a via hole extending through the silicon substrate 11, with an opening on the first principal surface 11A side covered by the electrode pad 14.

A cross-sectional shape of each through-hole 18 is preferably a tapered shape in which the opening in the first principal surface 11A (front face) is smaller than an opening in the second principal surface (back face) 11B because later-described back-face wirings 19 can easily be formed on wall faces thereof. However, each through-hole 18 may have, e.g., a columnar shape or a rectangular prism shape in which the opening in the first principal surface 11A has a same size as that of the opening in the second principal surface 11B.

An insulating layer (not illustrated) of, e.g., silicon oxide is formed on the through-holes 18, a trench portion 21 and the second principal surface 11B. Note that parts of the insulating layer on bottom faces 18B of the through-hole 18 are removed so that the electrode pads 14 are exposed. Inside each through-holes 18, that is, on the bottom face 18B, at which a back face of the corresponding electrode pad 14 is exposed, and a wall face 18A of each through-holes 18, a back-face wiring 19 extending so as to reach the second principal surface 11B is disposed. Note that the back-face wiring 19 includes a conductive film of, e.g., aluminum or copper. On the back-face wirings 19 on the second principal surface 11B, respective projecting external connection terminals (hereinafter also referred to as "external terminals") 20 each including, e.g., a gold bump or a solder ball for external electrical connection are disposed.

In conventional image pickup apparatus, not only light entering from the light-receiving portion side (first principal surface side) of the image pickup device, but also infrared light entering from the back face (second principal surface) side of the silicon substrate and passing through the silicon substrate reaches the image pickup device and is sensed by the image pickup device, which may result in the image pickup device outputting erroneous signals. That is, in conventional image pickup apparatuses, light entering from side faces of the semiconductor substrate may cause generation of erroneous signals in the image pickup device, resulting in unstable image pickup operation.

On the other hand, in the image pickup apparatus 1, a trench-shaped trench portion 21 is formed on the second principal surface 11B so as to surround the periphery of the image pickup device 13. In other words, the trench portion 21 is formed in a frame-like shape so as to surround a region of the second principal surface 11B immediately below the image pickup device 13 disposed in the first principal surface 11A. Note that the trench portion 21 only needs to surround at least the image pickup section 13A of the image pickup device 13.

A cross-sectional shape of the trench portion 21 is preferably a tapered shape in which an opening or a bottom face in the first principal surface 11A is smaller than an opening in the second principal surface 11B as with the through-holes 18. This is because a light blocking layer 22 can easily be disposed on wall faces thereof.

Here, it is particularly preferable that the trench portion 21 have a depth equal to a thickness of the silicon substrate 11, that is, the trench portion 21 extend through the silicon substrate 11, in other words, a thickness from the first principal surface 11A to a bottom face of the trench portion 21 of the silicon substrate 11 be 0 μm.

However, light entering the image pickup device 13 from side faces 11C can be blocked if the trench portion 21 has a depth that is 50 to 100%, preferably, 70 to 100% of the thickness of the silicon substrate 11. In other words, if the thickness of the silicon substrate 11 is 50 μm, the depth of the trench portion 21 is 25 to 50 μm, preferably, 35 to 50 μm, particularly preferably 50 μm. For example, if the thickness from the first principal surface 11A to the bottom face of the trench portion 21 of the silicon substrate 11, in other words, a distance between the bottom face of the trench portion 21 and the first principal surface 11A is no more than 10 μm, an amount of infrared light entering the image pickup device 13 from the side faces 11C can be blocked to reduce the light amount to a level at which no problem occurs.

A position where the trench portion 21 is formed is preferably a position where a side wall 21A inside the trench portion 21 having a tapered shape in a cross-section is 20 μm to 200 μm from an outer periphery of the image pickup section 13A. In the case of a position equal to or larger than the lower limit value of the range, formation of the trench portion 21 does not adversely affect the image pickup section 13A, and in the case of a position equal to or smaller than the upper limit value of the range, there is no hindrance to reduction in size of the image pickup apparatus 1.

On the side walls 21A and 21B of the trench portion 21 and the second principal surface 11B surrounded by the trench portion 21, the light blocking layer 22 for blocking infrared light adversely affecting the image pickup device 13 is disposed. The light blocking layer 22 disposed on the side walls (wall faces) 21A and 21B of the trench portion 21 blocks infrared light entering from the side faces 11C of the silicon substrate 11, and the light blocking layer 22 disposed on the second principal surface 11B blocks infrared light entering from the second principal surface 11B.

The light blocking layer 22 has a function that blocks infrared light that passes through the silicon substrate 11 and is detected by the image pickup device 13. In other words, the light blocking layer 22 blocks infrared light having wavelengths that pass through the silicon substrate 11 and are detected by the image pickup device 13. The light blocking layer 22 can prevent an adverse effect caused by infrared light if the light blocking layer 22 has, for example, a transmittance of no more than 5% for infrared light having wavelengths of 820 to 1170 nm.

For a material of the light blocking layer 22, e.g., a material that can block light, for example, a metal such as aluminum or copper, or an epoxy resin containing a light blocking substance such as carbon particles or a pigment may be employed. Note that for the material of the light blocking layer 22, a metal that is the same as the material of the back-face wirings 19 is particularly preferable. This is because the light blocking layer 22 and the back-face wirings 19 can simultaneously be disposed.

For example, since a transmittance of an aluminum film of 0.5 μm for the infrared light is 0.1%, a thickness of the light blocking layer 22 is preferably 0.2 to 5 μm.

In order to prevent infrared light from the side faces 11C from reaching the image pickup device 13, the light blocking layer 22 only needs to cover at least the side wall 21A on the inner side (the image pickup device 13 side) of the trench portion 21, and does not need to cover the side wall 21B on the outer side. It should be understood that the light blocking layer 22 may cover the side wall 21A and the side wall 21B and the inside of the trench portion 21 may be filled with the light blocking layer 22.

Next, a method for manufacturing the image pickup apparatus 1 according to the present embodiment will be described with reference to FIGS. 5A to 5E. FIGS. 5A to 5E are schematic diagrams each illustrating a cross-sectional structure in order to describe a method for manufacturing an image pickup apparatus according to the present embodiment.

Figure 5A:
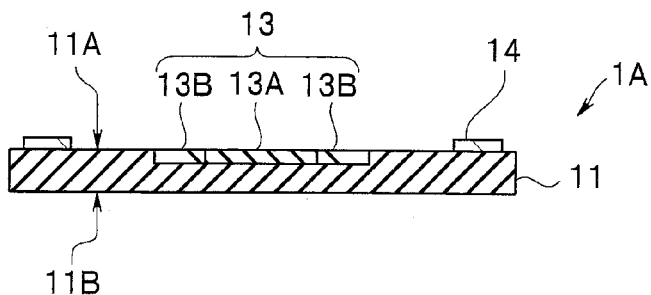
FIG. 5A is a cross-sectional view illustrating a method for manufacturing an image pickup apparatus according to an embodiment.

<Device Substrate Fabricating Step> FIG. 5A

A silicon substrate 11 including a flat plate of single-crystal silicon and including a first principal surface 11A in which an image pickup device 13 is disposed, and a second principal surface 11B facing the first principal surface 11A.

An image pickup section 13A of the image pickup device 13 includes, e.g., a CCD image sensor or a CMOS image sensor that senses visible light and infrared light. Note that although FIG. 5A indicates an example in which the image pickup device 13 is disposed inside the silicon substrate 11, an image pickup device 13 disposed separately from the silicon substrate 11 may be provided on the silicon substrate 11.

A peripheral circuit portion 13B of the image pickup device 13 is electrically connected to electrode pads 14 via front-face wirings 12 (not illustrated in, e.g., FIG. 5A). The front-face wirings 12 may be a multilayered wiring layer. The multilayered wiring layer is, for example, a three-dimensional wiring layer including a plurality of conductor wiring layers insulated by a plurality of inter-layer insulating layers, the three-dimensional wiring layer being disposed by, e.g., repeatedly performing disposition of a conductor layer including aluminum, conductor layer patterning, disposition of an inter-layer insulating layer including, e.g., a silicon oxide film and planarization by means of CMP (chemical-mechanical polishing) in this order. For the inter-layer insulating layer, silicon nitride, polyimide or any of various known low-k materials can be used.

Furthermore, although not illustrated, a protection film including openings at parts corresponding to the electrode pads 14 may be disposed on the first principal surface 11A. Also, a part of each of the front-face wirings 12 may be used as the corresponding electrode pad 14.

Through the above-described steps, a device substrate 1A including the plurality of front-face wirings 12 connected to the image pickup device 13 and the electrode pads 14 connected to the image pickup device 13 via the plurality of front-face wirings 12 is prepared.

Figure 5B:
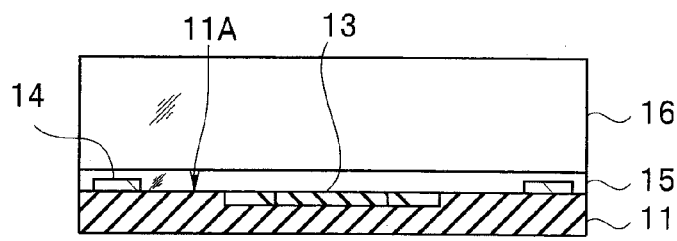
FIG. 5B is a cross-sectional view illustrating the method for manufacturing the image pickup apparatus according to the embodiment.

<Transparent Substrate Bonding Step> FIG. 5B

A glass substrate 16 that protects, e.g., the image pickup device 13 is bonded to the first principal surface 11A of the device substrate 1A via a bonding layer 15. In other words, the glass substrate 16 is adhered to the silicon substrate 11 so as to cover the first principal surface 11A via the bonding layer 15 including, e.g., an epoxy resin. It is desirable that the transparent substrate and the bonding layer 15 each have a transmittance of no less than 90% for a wavelength region of light from which the image pickup device 13 picks up an image.

The glass substrate 16 functions as a holding member for the device substrate 1A in a through-hole/trench portion forming step and also has a function that protects, e.g., the image pickup device 13 in a manufacturing step. In other words, an image pickup apparatus in which a transparent substrate is bonded is highly reliable, and a method for manufacturing an image pickup apparatus, the method including a transparent substrate bonding step has a high manufacturing yield.

Note that on a light receiving region of the image pickup device 13, an airspace may be provided between the glass substrate 16 and the light receiving region instead of disposing the bonding layer 15.

Figure 5C:
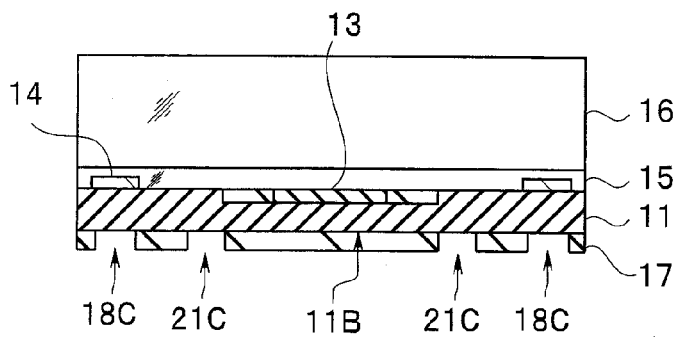
FIG. 5C is a cross-sectional view illustrating the method for manufacturing the image pickup apparatus according to the embodiment.
Figure 5D:
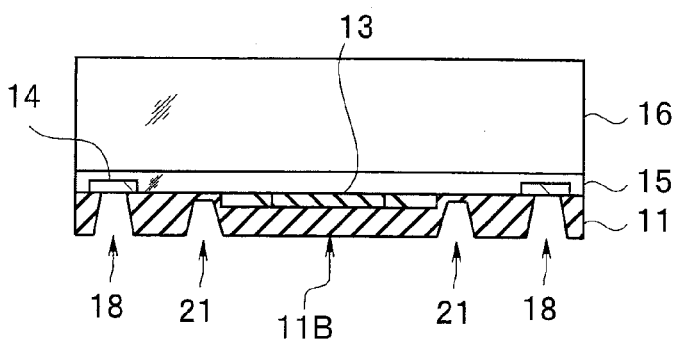
FIG. 5D is a cross-sectional view illustrating the method for manufacturing the image pickup apparatus according to the embodiment.

<Through-Hole/Trench Portion Forming Step> FIGS. 5C and 5D

Next, as illustrated in FIG. 5C, an etch mask layer 17 including openings 18C at positions of the second principal surface 11B facing the respective electrode pads 14 and a frame-like opening 21C at a position of the second principal surface 11B surrounding the image pickup device 13 is disposed. The etch mask layer 17 is, for example, a hard mask including a silicon oxide film or a soft mask including a photoresist.

Then, as illustrated in FIG. 5D, from the second principal surface 11B side, the silicon substrate 11 is etched to simultaneously form a plurality of through-holes 18 and a trench portion 21. The through-holes 18 and the trench portion 21 each have a tapered shape in which an opening in the second principal surface 11B is larger than an opening or a bottom face in the first principal surface.

Note that if a single-crystal silicon is etched using an etching process with a large etching selectivity for single-crystal silicon/silicon oxide, for example, wet etching processing using a TMAH solution, a silicon oxide insulating layer below the electrode pads 14 is hardly etched, and the insulating layer serves as an etching stop layer. In other words, as illustrated in FIG. 5D, the through-holes 18 are formed as via holes each extending through the silicon substrate 11, with an opening on the first principal surface 11A side covered by the corresponding electrode pad 14.

Here, if a width of the opening 21C is smaller than a width of each of openings 18C, the trench portion 21 does not extend though the silicon substrate 11 even if the etching processing is simultaneously performed. It should be understood that the trench portion 21 may be made to extend through the silicon substrate 11 by adjusting the opening width.

The through-holes 18 and the trench portion 21 each having a tapered shape can easily be formed by, for example, using a single-crystal silicon (100) substrate for the silicon substrate 11 and performing wet etching processing using an alkaline solution such as KOH or TMAH, because the etching becomes anisotropic etching in which an etching rate in a <100> direction is relatively higher than an etching rate in a <111> direction.

Furthermore, dry etching processing such as ICP-RIE may be used for formation of the through-holes 18 and the trench portion 21 each having a tapered shape, and for example, through-holes each having a tapered shape and a desired angle of inclination of wall faces can be formed by properly adjusting a gas flow ratio between $SF_6$ and $C_4F_8$. Where anisotropic wet etching is used, the angle of inclination is uniquely determined to be 54.7 degrees relative to an etching start principal surface. On the other hand, where dry etching processing is used, through-holes each having a tapered shape and having a gradient higher than 54.7 degrees can be formed, and thus, dry etching processing is available also for a case where a pitch (arrangement interval) of electrode pads is small.

Figure 5E:
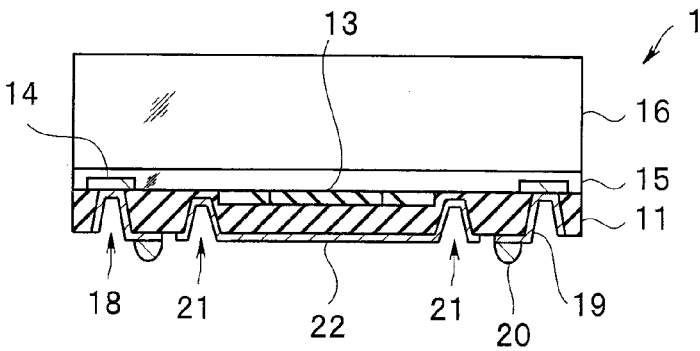
FIG. 5E is a cross-sectional view illustrating the method for manufacturing the image pickup apparatus according to the embodiment.

<Back-Face Wiring/Light Blocking Layer Disposing Step>
FIG. 5E

An insulating layer (not illustrated) of, e.g., silicon oxide is disposed on the through-holes 18, the trench portion 21 and the second principal surface 11B from the second principal surface 11B side. After the insulating layer is partially removed so that the electrode pads 14 at the bottom faces 18B of the through-holes 18 are exposed, back-face wirings 19 and a light blocking layer 22 are simultaneously disposed. In other words, a conductive film of, e.g., aluminum or copper is formed on the second principal surface 11B by means of a sputtering method or a vapor deposition method.

Next, parts of the conductive film other than the back-face wirings 19 and the light blocking layer 22 that are covered by a photoresist are removed.

Then, a protective layer disposing step of covering the second principal surface 11B side with a protective layer (not illustrated) including openings at regions where external terminals are disposed, and an external terminal disposing step of disposing external terminals 20 such as bumps including, e.g., copper or solder are performed.

Note that for ease of the description, the description has been provided taking a case where one image pickup apparatus 1 is manufactured as an example. It is preferable, however, from the perspective of mass productivity that a number of image pickup apparatuses 1 be manufactured in a batch by a wafer process and the wafer be divided into individual image pickup apparatuses in a final step.

As described above, the image pickup apparatus 1 includes the trench portion 21 formed from the second principal surface 11B side so as to have a frame-like shape and surround the periphery of a region facing the image pickup device 13, and the light blocking layer 22 covering the region of the second principal surface 11B surrounded by the trench portion 21. Note that even with a silicon substrate 11 including through-holes, a part of light entering from side faces thereof passes through the through-holes and thus enters the image pickup device, which may result in generation of erroneous signals. However, in the image pickup apparatus 1, the light blocking layer disposed on the trench portion 21 blocks entrance of light from the side faces 11C of the silicon substrate 11 to the image pickup device 13. Furthermore, the light blocking layer covering the region of the second principal surface 11B surrounded by the trench portion 21 blocks entrance of light from the second principal surface 11B to the image pickup device 13.

Accordingly, the image pickup apparatus 1 does not cause generation of erroneous signals in the image pickup device 13 resulting from light entering the image pickup device 13 from the second principal surface 11B of the silicon substrate 11 and the side faces 11C of the silicon substrate 11, and thus, provides stable image pickup operation.

Furthermore, the light blocking layer 22 and the back-face wirings 19 can simultaneously be disposed using a same material, there is no need to provide an additional step of disposing the light blocking layer 22.

Furthermore, at the time of formation of the through-holes 18, the trench portion 21 can simultaneously be formed, thereby eliminating the need to provide an additional step of forming the trench portion.

In other words, the image pickup apparatus 1 manufactured by the above-described method provides stable image pickup operation.

The present invention is not limited to the above-described embodiments and modifications and the like, and various modifications and alterations are possible without departing from the spirit of the present invention.

What is claimed is:

1. An image pickup apparatus comprising:
a semiconductor substrate including a first principal surface and a second principal surface facing the first principal surface, the semiconductor substrate transmitting infrared light;
an image pickup device disposed in the first principal surface, the image pickup device including an image pickup section that senses visible light and the infrared light, and a peripheral circuit portion that is disposed in a periphery of the image pickup section;
an electrode pad disposed on the first principal surface;
a front-face wiring disposed on the first principal surface, the front-face wiring connecting the image pickup device and the electrode pad;
an external connection terminal disposed on the second principal surface;
a back-face wiring disposed on the second principal surface, the back-face wiring connecting the electrode pad and the external connection terminal via a substrate through-hole extending from the second principal surface through the semiconductor substrate to a back face of the electrode pad;
a trench portion formed in a frame-like shape as to surround a region of the second principal surface corresponding to the image pickup device disposed in the first principal surface; and
a light blocking layer disposed on the second principal surface so as to cover an internal surface of the trench portion and the region surrounded by the trench portion;
wherein the light blocking layer covers an entirety of the region surrounded by the trench portion and completely covers an inner side of the trench portion.

2. The image pickup apparatus according to claim 1, wherein a depth of the trench portion is 50% to 100% of a thickness of the semiconductor substrate.

3. The image pickup apparatus according to claim 2, wherein a thickness from a bottom face of the trench portion to the first principal surface of the semiconductor substrate is no more than 10 μm.

4. The image pickup apparatus according to claim 3, wherein the light blocking layer and the back-face wiring include a same material.

5. The image pickup apparatus according to claim 4, wherein the light blocking layer and the back-face wiring are simultaneously formed.

6. The image pickup apparatus according to claim 5, wherein the light blocking layer and the back-face wiring each include a metal having an infrared light transmittance of no more than 5%.

7. The image pickup apparatus according to claim 6, wherein the substrate through-hole and the trench portion are simultaneously formed.

8. The image pickup apparatus according to claim 7, wherein the substrate through-hole has a tapered shape in which an opening in the first principal surface is smaller than an opening in the second principal surface, and the trench portion has a tapered shape in which an opening or the bottom face in the first principal surface is smaller than the opening in the second principal surface.

9. The image pickup apparatus according to claim 8, wherein a transparent substrate is bonded to the first principal surface of the semiconductor substrate.

10. The image pickup apparatus according to claim 1, wherein the trench portion has at least first and second sides to define the region of the second principal surface and the light blocking layer is disposed continuously from the first side to the second side.

11. The image pickup apparatus according to claim 1, wherein the internal surface of the trench portion comprises first and second surfaces extending from the second principal surface towards the first principal surface and the light blocking layer is disposed on one or more of the first and second surfaces.

* * * * *